(12) United States Patent
Bloom et al.

(10) Patent No.: US 9,257,478 B2
(45) Date of Patent: Feb. 9, 2016

(54) SPATIALLY RESOLVED SPECTRAL-IMAGING DEVICE

(71) Applicant: The Regents of the University of California, Oakland, CA (US)

(72) Inventors: Joshua Simon Bloom, Berkeley, CA (US); John Anthony Tyson, Winters, CA (US)

(73) Assignee: The Regents of the University of California, Oakland, CA (US)

( * ) Notice: Subject to any disclaimer, the term of this patent is extended or adjusted under 35 U.S.C. 154(b) by 331 days.

(21) Appl. No.: 13/900,418

(22) Filed: May 22, 2013

(65) Prior Publication Data
US 2013/0313408 A1    Nov. 28, 2013

Related U.S. Application Data

(60) Provisional application No. 61/650,351, filed on May 22, 2012.

(51) Int. Cl.

| | |
|---|---|
| *H01L 27/148* | (2006.01) |
| *G01J 1/04* | (2006.01) |
| *G01J 3/28* | (2006.01) |
| *G01J 3/36* | (2006.01) |
| *G01J 3/02* | (2006.01) |

(52) U.S. Cl.
CPC ......... *H01L 27/14806* (2013.01); *G01J 1/0488* (2013.01); *G01J 3/0208* (2013.01); *G01J 3/0259* (2013.01); *G01J 3/0286* (2013.01); *G01J 3/2803* (2013.01); *G01J 3/2823* (2013.01); *G01J 3/36* (2013.01)

(58) Field of Classification Search
CPC ............ H01L 27/014806; G01J 1/0488; G01J 3/2803; G01J 3/2823; G01J 3/36; G01J 3/0259; G01J 3/0286; G01J 3/0208

See application file for complete search history.

(56) References Cited

U.S. PATENT DOCUMENTS

| | | | |
|---|---|---|---|
| 3,971,065 A | 7/1976 | Bayer | |
| 4,654,698 A * | 3/1987 | Langworthy | 348/238 |
| 5,286,338 A | 2/1994 | Feldblum et al. | |
| 5,920,347 A | 7/1999 | Aoki | |
| 5,942,762 A * | 8/1999 | Hecht | 250/556 |

(Continued)

OTHER PUBLICATIONS

Li, X. et al. (2001). "Deep Reactive Ion Etching of Pyrex Glass Using $SF_6$ Plasma", *Sensors and Actuators* A:87(139-145).

(Continued)

*Primary Examiner* — John Lee
(74) *Attorney, Agent, or Firm* — Lowenstein Sandler LLP (57) ABSTRACT

A spatially resolved spectral device comprising a dispersive array to receive an incident light comprising a principal ray. The dispersive array comprising a plurality of dichroic layers, each of the plurality of dichroic layers disposed in a path of a direction of the principal ray. Each of the plurality of dichroic layers configured to at least one of reflect or transmit a different wavelength range of the incident light. The device further comprising a detection array operatively coupled with the dispersive array. The detection array comprising a photosensitive component including a plurality of detection pixels, each of the plurality of detection pixels having a light-receiving surface disposed parallel to the direction of the principal ray to detect a respective one of the different wavelength ranges of incident light reflected from a corresponding one of the plurality of dichroic layers.

20 Claims, 7 Drawing Sheets

(56) References Cited

U.S. PATENT DOCUMENTS

| | | | |
|---|---|---|---|
| 5,965,875 A | 10/1999 | Merrill | |
| 6,638,668 B2* | 10/2003 | Buchsbaum et al. | 430/7 |
| 6,785,002 B2* | 8/2004 | Zarrabian et al. | 356/454 |
| 6,825,928 B2* | 11/2004 | Liu et al. | 356/317 |
| 7,138,663 B2 | 11/2006 | Hoshuyama | |
| 2004/0233664 A1* | 11/2004 | Beeson et al. | 362/231 |
| 2005/0143663 A1* | 6/2005 | Liu et al. | 600/476 |
| 2006/0097134 A1* | 5/2006 | Rhodes | 250/214.1 |
| 2006/0151796 A1* | 7/2006 | Kobayashi et al. | 257/85 |
| 2006/0221336 A1* | 10/2006 | Boege | 356/317 |
| 2007/0023770 A1* | 2/2007 | Miyajima et al. | 257/88 |
| 2007/0121112 A1* | 5/2007 | Kato | 356/419 |
| 2007/0291149 A1* | 12/2007 | Kondo et al. | 348/311 |
| 2009/0039454 A1* | 2/2009 | Masuda et al. | 257/432 |
| 2010/0065726 A1* | 3/2010 | Zhong et al. | 250/227.24 |
| 2010/0258847 A1* | 10/2010 | Wadsworth | 257/221 |
| 2011/0175185 A1* | 7/2011 | Asher et al. | 257/432 |
| 2012/0021525 A1* | 1/2012 | Fehr et al. | 436/94 |
| 2012/0050599 A1* | 3/2012 | Chen | 348/336 |
| 2012/0123205 A1* | 5/2012 | Nie et al. | 600/109 |
| 2013/0011561 A1* | 1/2013 | Marsh et al. | 427/282 |
| 2013/0313408 A1* | 11/2013 | Bloom et al. | 250/208.1 |
| 2015/0029504 A1* | 1/2015 | Auner et al. | 356/301 |

OTHER PUBLICATIONS

Greiner, J. et al. (2008). "GROND-A 7-Channel Imager," Publications of the Astronomical Society of the Pacific, 120 (866):405-424.

* cited by examiner

Spatial-spectral imaging matrix 600

US 9,257,478 B2

SPATIALLY RESOLVED SPECTRAL-IMAGING DEVICE

RELATED APPLICATIONS

This application claims the benefit of U.S. Provisional Patent Application No. 61/650,351, filed on May 22, 2012, which is hereby incorporated by reference.

STATEMENT OF GOVERNMENTAL SUPPORT

This invention was made with government support under Contract No. DE-AC02-05CH11231 awarded by the U.S. Department of Energy. The government has certain rights in this invention.

TECHNICAL FIELD

The present invention relates generally to the field of spectroscopy and, in particular, to a spatially resolved spectral-imaging device.

BACKGROUND

The efficient capture and recording of a photonic scene, often changing dynamically in time, lies at the heart of nearly all modern observational sciences. And while each discipline utilizes specialized instrumentation, there are three fundamental building blocks that are common to all approaches: fore-optics (meant to focus and sometimes disperse light spectrally), detection devices (which capture light and convert it to an analog signal), and digitization electronics (providing the conversion of the analog measurement to digital bits).

A goal of such instrumentation may be to capture and record the energy and polarization of each incoming photon, the location of each photon in the focal plane, and the time of arrival at the focal plane. If indeed every measurable property of every photon is saved digitally, then the building up a complete "movie" of the recorded scene would require post process binning spatially, spectrally, and temporally. As a practical matter, however, such binning is usually accomplished by the instrumentation itself: detectors are exposed for a finite integration time to collect a sufficient number of photons to overcome background and instrumentation noise. The spectral energy distribution (i.e., intensity of a function of wavelength) of the incoming light may be discerned by introducing spectral elements, such as diffraction gratings, into the fore-optics, and recording intensity differences across the spectrum at different spatial location on the detectors. In low-light scenes or in rapidly changing scenes, there is a fundamental trade-off between efficiency of photon detection including the quantum efficiency of detectors, spectral resolution, spatial resolution, and temporal resolution.

BRIEF DESCRIPTION OF THE DRAWINGS

The present disclosure will be understood more fully from the detailed description given below and from the accompanying drawings of various embodiments of the present disclosure, which, however, should not be taken to limit the present disclosure to the specific embodiments, but are for explanation and understanding only.

DETAILED DESCRIPTION

In the following description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the disclosure. The phrase "in one embodiment" located in various places in this description does not necessarily refer to the same embodiment.

Embodiments of an apparatus and method of the present disclosure describe the detection of the spectral, spatial, and temporal elements of light. When detecting light, conventional applications trade-off between increasing the spectral resolution and decreasing the spatial resolution, and vice versa. However, both users and designer may benefit from increasing both spectral and spatial resolution, simultaneously.

Figure 1:
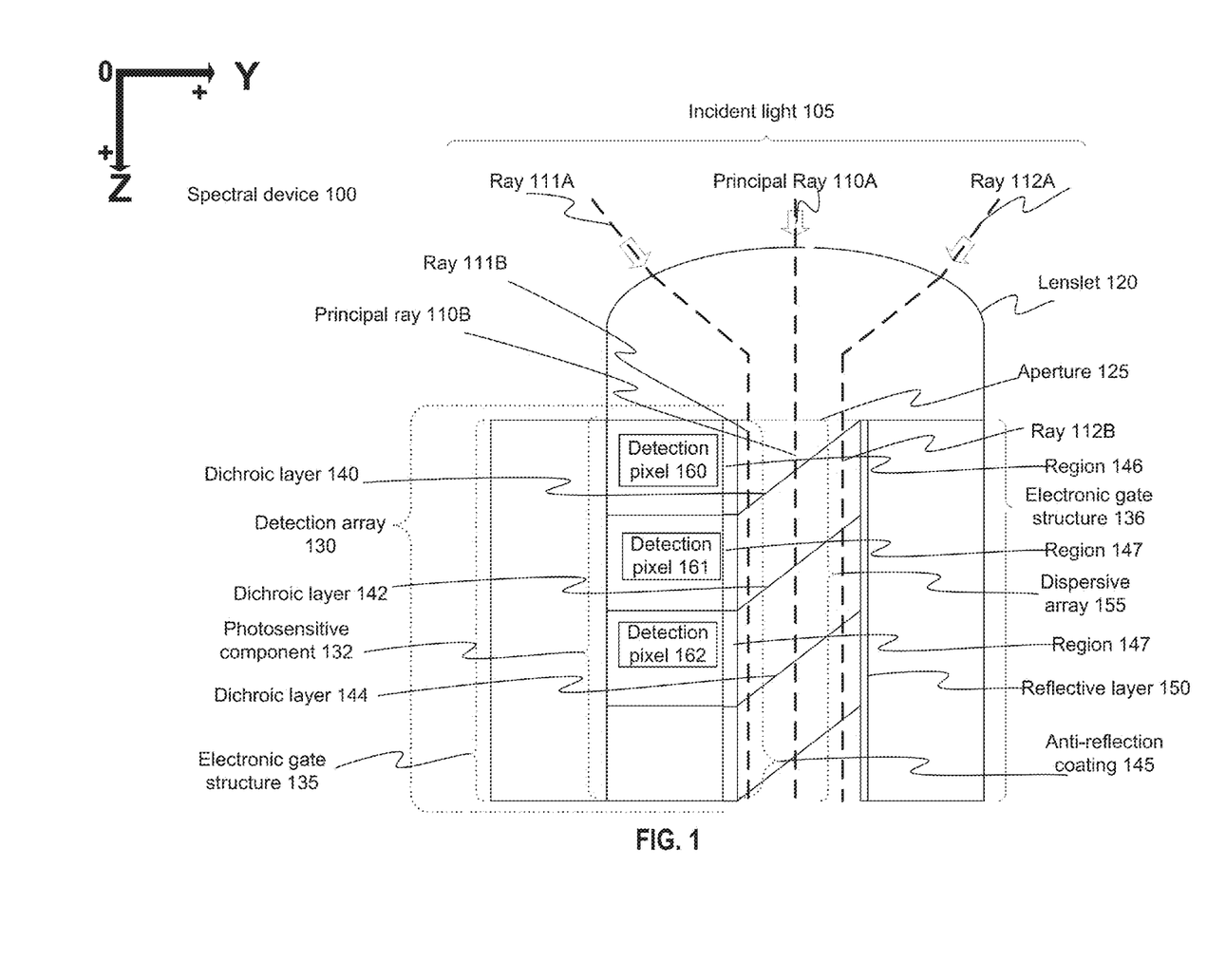
FIG. 1 is a block diagram illustrating one embodiment of a spectral device.

FIG. 1 is a block diagram illustrating a cross-section of a component of one embodiment of a spectral device. Electromagnetic beam radiation, incident light 105 including ray 111A, principal ray 110A, and ray 112A, is incident upon spectral device 100 (i.e., heading towards the positive Z-direction), incident first on the lenslet 120, which may be at or very near the focal plane of the beam of radiation. Here, the focal plane is taken to be co-planar (or nearly co-planar) with the X-Y plane. Light is also incident at other X- and Y-locations (not shown). In another embodiment, incident light 105 upon the spectral device 100 may be light incident on the lenslet 120. In one embodiment, the incident light 105 is from the foreoptics, not shown, and on a converging path. In another embodiment, the focus is above the spectral device 100 (i.e., smaller-Z), with the incoming beam diverging. The foreoptics, not shown, may be part of a system of mirrors and refractive lenses, such as in a telescope, industrial camera, or consumer camera. In one embodiment, the focus (in the Z-direction) of the incident light 105 may be the same or nearly the same across the wavelength range of interest. The optics of the lenslet 120 are manufactured to match the specifications of the incoming beam (i.e., diverging or converging, f/ratio, chromatic focal differences) such that the outgoing beam, principal ray 110B, ray 111B, ray 112B, is collimated or nearly collimated, which is parallel to or substantially parallel to the Z-axis. It should be noted that, principal ray 110A and 110B are perpendicular (or nearly perpendicular) to the aperture 125 and are parallel to the Z-axis. In another embodiment, spectral device 100 does not comprise a lenslet 120. Such an embodiment may reduce the efficiency of light detection.

The collimated radiation, principal ray 110B, ray 111B, ray 112B, propagates down (e.g., relative to the perspective in the illustrated embodiment) dispersive array 155 towards a larger-Z. For n=1 through z dichroic layers (e.g., dichroic layer 140, 142, 144) in the path of the collimated radiation (i.e., principal ray 110B, ray 111B, ray 112B) there is a critical wavelength for reflectance $\lambda c,n$ (hereinafter, "$\lambda n$") at each dichroic layer (e.g., dichroic layer 140, 142, 144). At dichroic layer n (e.g., dichroic layer 140) most of the incident light 105 with wavelength less than $\lambda n$ is reflected towards detection array 130 in the negative Y-direction. Most incident light 105 with $\lambda > \lambda n$ is transmitted in the dispersive array 155 in an increasing Z-direction. Thus dichroic layers 140, 142, and 144, show three successive layers for a "long-pass" design ($\lambda n+1 > \lambda n$). In FIG. 1, the dichroic layers (e.g., dichroic layer 140, 142, and 144) are positioned at 45-degrees, clockwise with respect to the positive Y-axis. In other embodiments, the dichroic layers (e.g., dichroic layer 140, 142, and 144) may be at a different angle, chosen to maximize the efficiency of the desired transmission and reflection. In one embodiment, there are z dichroic layers (e.g., dichroic layer 140, 142, and 144). The last dichroic layer (not shown), the zth, can be fully reflective. In another embodiment, the dichroics layers (e.g., dichroic layer 140, 142, and 144) are "short pass" layers such that ($\lambda n+1 < \lambda n$).

In one embodiment, the anti-reflection coating 145 allows incident light 105 at a predetermined waveband to efficiently transmit from the dispersive array 155 to the detection array 130. In one embodiment, the anti-reflection coating 145 is located between the dispersive array 155 and the detection array 130. In another embodiment, the anti-reflection coating 145 is configured with optical properties that change in the Z-direction. The anti-reflection coating 145 may have regions (e.g., region 146, 147, 148) that increase the transmission efficiency of incident light 105 to the detection array 130 in accordance to different wavelengths. For example, the wavelength range over which the transmission efficiency of region 147 is maximized may correspond to the wavelength range between the critical wavelength of dichroic layer 140 and dichroic layer 142.

In another embodiment, a reflective layer 150 is coupled to the dispersive array 155, on a side opposite the photosensitive component 132, to reflect incident light 105 towards photosensitive component 132. In one embodiment, reflective layer 150 may be a broadband, highly reflective surface on the dispersive array 155 opposite the detection array 130. For example, the reflective layer 150 may be a mirror-like coating. The reflective layer 150 may be used for improved light detection efficiency by reflecting any stray light back towards the detection array 130.

Figure 2:
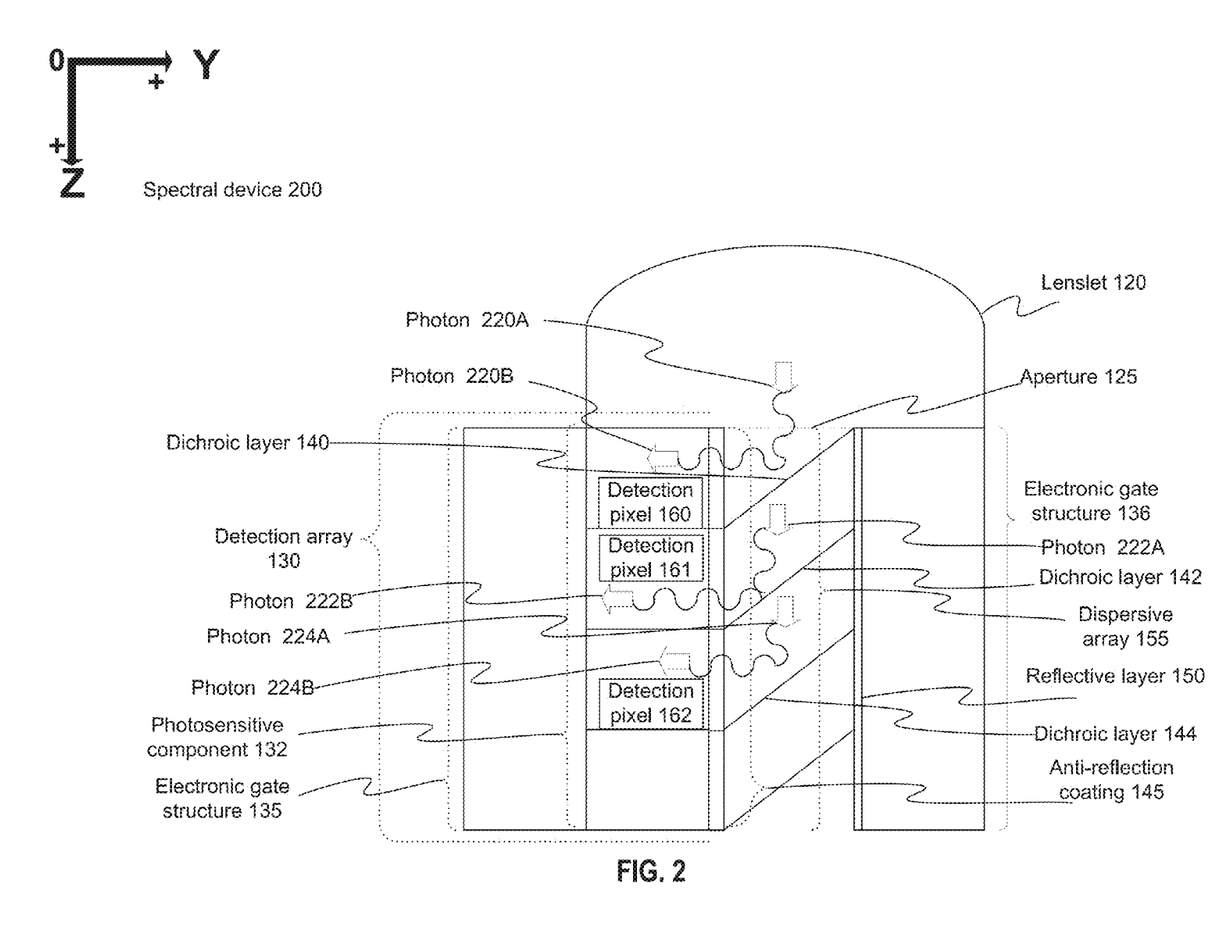
FIG. 2 is a block diagram illustration a spectral device in accordance to another embodiment.

FIG. 2 is a block diagram illustration a spectral device 200 in accordance to another embodiment. Incident light 105, demonstrated by photon 220A, 222A, and 224A, travels through the dispersive array 155 until it is reflected by a dichroic layer (e.g., dichroic layer 140, 142, 144). The reflected light (e.g., photon 220B, 222B, 224B) travels in the negative Y-direction towards detection array 130. For example, a photon 220A travels in the positive Z-direction until it is reflected, illustrated by photon 220B. Photon 220B is absorbed in the photosensitive component 132. The photosensitive component 132 may be pixelated as illustrated by detection pixel 160, 161, and 162. In one embodiment, detection pixels 160, 161, and 162 may be charged coupled devices (CCDs) and the electronic gate structure 135 may be a polysilicon readout electrode structure. It should be noted that the detection pixels (e.g., detection pixel 160, 161, 162) may be disposed parallel to or nearly parallel to the principal ray 110A. In another embodiment, the total Y-dimension thickness of the photosensitive component 132 and the electronic gate structure 135 may be similar to the Y-dimension thickness of dispersive array 155. In another embodiment, the total thickness of lenslet 120 in the Y-dimension may be nearly equal to the combined thickness of photosensitive component 132, the electronic gate structure 136, and the dispersive array 155. In one embodiment, and shown in FIG. 2, a typical "back-side illuminated" CCD is demonstrated. A back-side illuminated configuration is where the photosensitive area, such as photosensitive component 132, is shown at larger-Y and the electronic gate structure 135 at smaller-Y. In another embodiment, the Y-direction ordering of the photosensitive component 132 and the electronic gate structure 135 can be reversed as a "front-side illuminated" array. In another embodiment, selected detection pixels (e.g., detection pixel 160) at smaller-Z may be back-side illuminated and other detection pixels (e.g., detection pixel 162), at a larger-Z could be front-side illuminated. CCDs are most photosensitive in the visible-light portion of the electromagnetic spectrum. In other embodiments, the photosensitive component 132 may have the most quantum efficiency at wavelength ranges outside of the visible-light portion, such as at ultraviolet or infrared wavelengths.

Downward (e.g., relative to the perspective in the illustrated embodiment) propagating light—photon 220A, photon 222B, and photon 224B—traveling in the positive Z-direction through the dispersive array 155 contains a range of wavelengths. At dichroic layer 140, with critical wavelength $\lambda n-1$, a downward (e.g., relative to the perspective in the illustrated embodiment) propagating photon 220A with wavelength less than $\lambda n-1$ is reflected (i.e., photon 220B) in the negative Y-direction towards the detection pixel 160. Photon 220B passes through the anti-reflection coating 145 as described above. As illustrated, the shorter wavelength blue light is reflected at the uppermost dichroic layer 140, while the longer wavelength visible light (i.e., photon 222A, 224A) passes through the dichroic layer 140 towards dichroic layer 142. At dichroic layer 142, with critical wavelength $\lambda n$ which is greater than $\lambda n-1$, a downward (e.g., relative to the perspective in the illustrated embodiment) propagating photon 222A with wavelength between $\lambda n-1$ and $\lambda n$ is reflected (i.e., photon 222B) in the negative Y-direction towards detection pixel 161. Photon 222B passes through anti-reflection coating 145 which, as described above, in one embodiment, may be fabricated to maximize the detection efficiency of light with wavelength between $\lambda n-1$ and $\lambda n$ in detection pixel 161. The longer wavelength visible light (i.e., photon 224A) passes through the dichroic layer 142 towards dichroic layer 144. At dichroic layer 144, with critical wavelength $\lambda n+1$, which is greater than $\lambda n$, a downward (e.g., relative to the perspective in the illustrated embodiment) propagating photon 224A with wavelength between $\lambda n$ and $\lambda n+1$ is reflected (i.e., photon 224B) in the negative Y-direction towards detection pixel 162. Photon 224B passes through anti-reflection coating 145 which, as described above, in one embodiment, may be fabricated to maximize the detection efficiency of light with wavelength between $\lambda n$ and $\lambda n+1$ in detection pixel 162.

In one embodiment, light (e.g., photon 220A, 222A, 224A) travelling in the Z-direction towards the base of the spectral device 200 through the dispersive array 155 is reflected at a monotonically increasing wavelength in the negative Y-direction towards the detection array 130. By engineering the bandpass of each successive dichroic layer, (e.g., dichroic layer 140, 142, and 144) to have either increasing or decreasing bandpass wavelength, a finely differentiated spectrum may be obtained. In one embodiment, "narrow band" filters, where $|\lambda n-1-\lambda n|/\lambda n \ll 1$, can be obtained by implementing as many incremental dichroic layers (e.g. dichroic layer 140, 142, and 144). Such an embodiment could optimize light detection for a given device (e.g. spectral device 200). In one embodiment, the spectral device 200 can have as few as two bands (resolution R=2) comprising 1 dichroic layer (e.g., dichroic layer 140). In another embodiment, one with broad utility for commercial applications, spectral device 200 can have R=3 bands to separate blue, green, and red with the critical wavelengths of the 2 dichroic layers (e.g., dichroic layer 140 and 141) manufactured to be similar to give a similar spectral response as in commercial cameras. In another embodiment, the spectral device 200 may have greater than 3 bands.

In one embodiment, the electronic gate structure 135 may transmit electrical signals received from the photosensitive component 132. In another embodiment, the electronic gate structure 135 may digitize the analog signal received from the photosensitive component 132. For example, the electronic gate structure 135 may, for example, contain clocking electronics, power supply, and an analog to digital converter (A/D). In one embodiment, digitized electric signals from the electronic gate structure 135 are transferred to and stored on a computer or multiple computers with appropriate storage capacity. In another embodiment, the photosensitive component 132 and the electronic gate structure 135 may be exposed to incoming radiation and read out as often or as infrequently as demanded by the application. It should be noted that electronic gate structure 136 corresponds to an adjacent spectral device (not shown) while electronic gate structure 135 corresponds to the adjacent photosensitive component 132.

Figure 3:
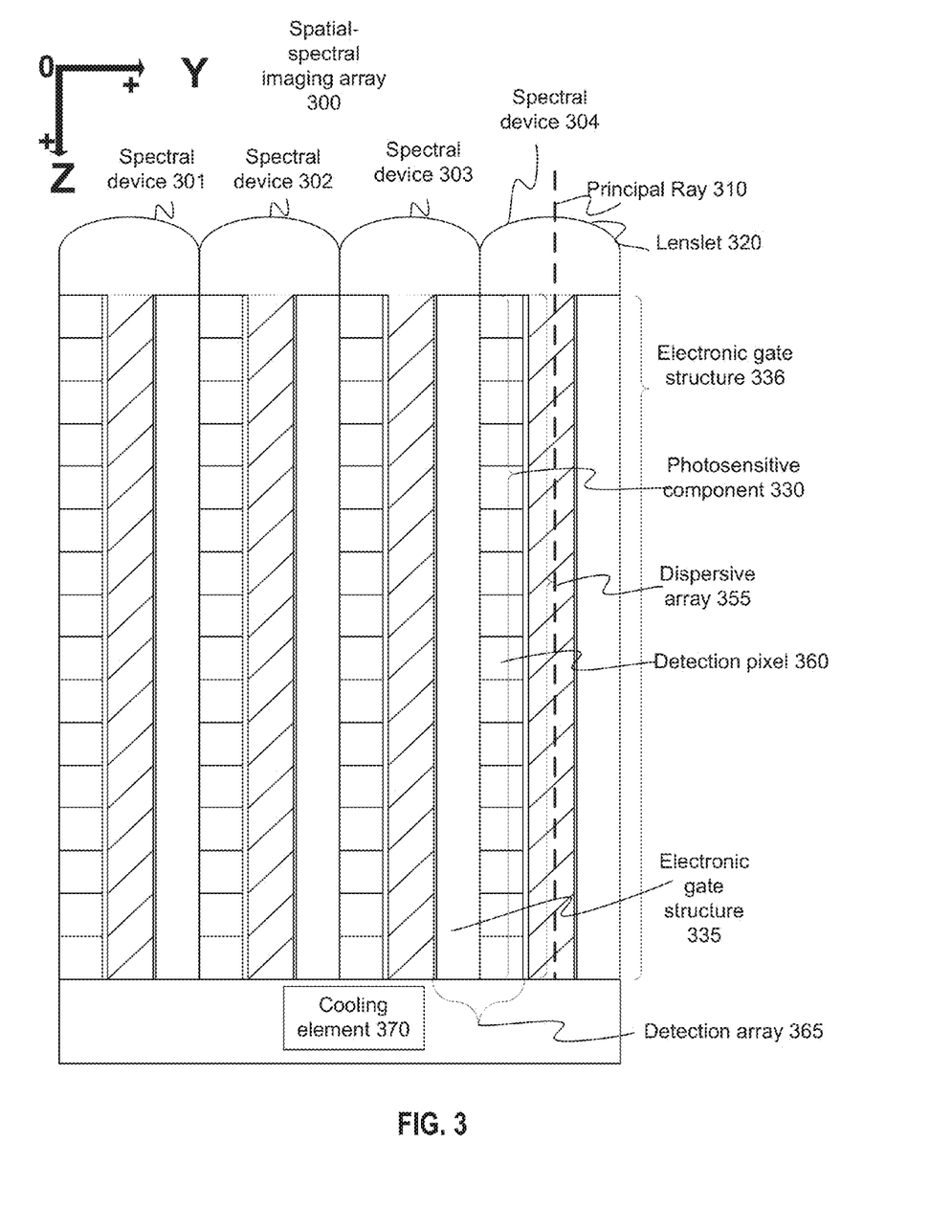
FIG. 3 is a block diagram illustration of a spatial-spectral imaging array in accordance to one embodiment.

FIG. 3 is a block diagram illustration of a spectral-imaging array 300 in accordance to one embodiment. A spectral-imaging array 300 may contain numerous light detection devices, (e.g., spectral device 301, 302, 303, 304). In one embodiment, the light detection devices, (e.g., spectral device 301, 302, 303, 304) may be exposed to incoming radiation (e.g., principal ray 310) and read out as often or as infrequently as demanded by the application. In another embodiment, the light detection devices, (e.g., spectral device 301, 302, 303, 304) need not necessarily be read out simultaneously if different exposure levels are required at different spatial locations along the Y-direction.

High-efficiency, low-noise radiation detection devices (e.g., spectral device 301, 302, 303, 304) often require thermal cooling to achieve peak performance. By affixing a cooling element 370 to the bottom (largest-Z) of the spectral-imaging array 300, a thermal pathway via the dispersive arrays (e.g., dispersive array 355) to cool the detection array (e.g., detection array 365) at the smallest-Z is established. This cooling element 370 may not be needed in all embodiments of the present device. In an alternative embodiment, the cooling element 370 may have cooling fingers on multiple sides (largest-X and smallest-X) of the spectral-imaging array 300.

Figure 4:
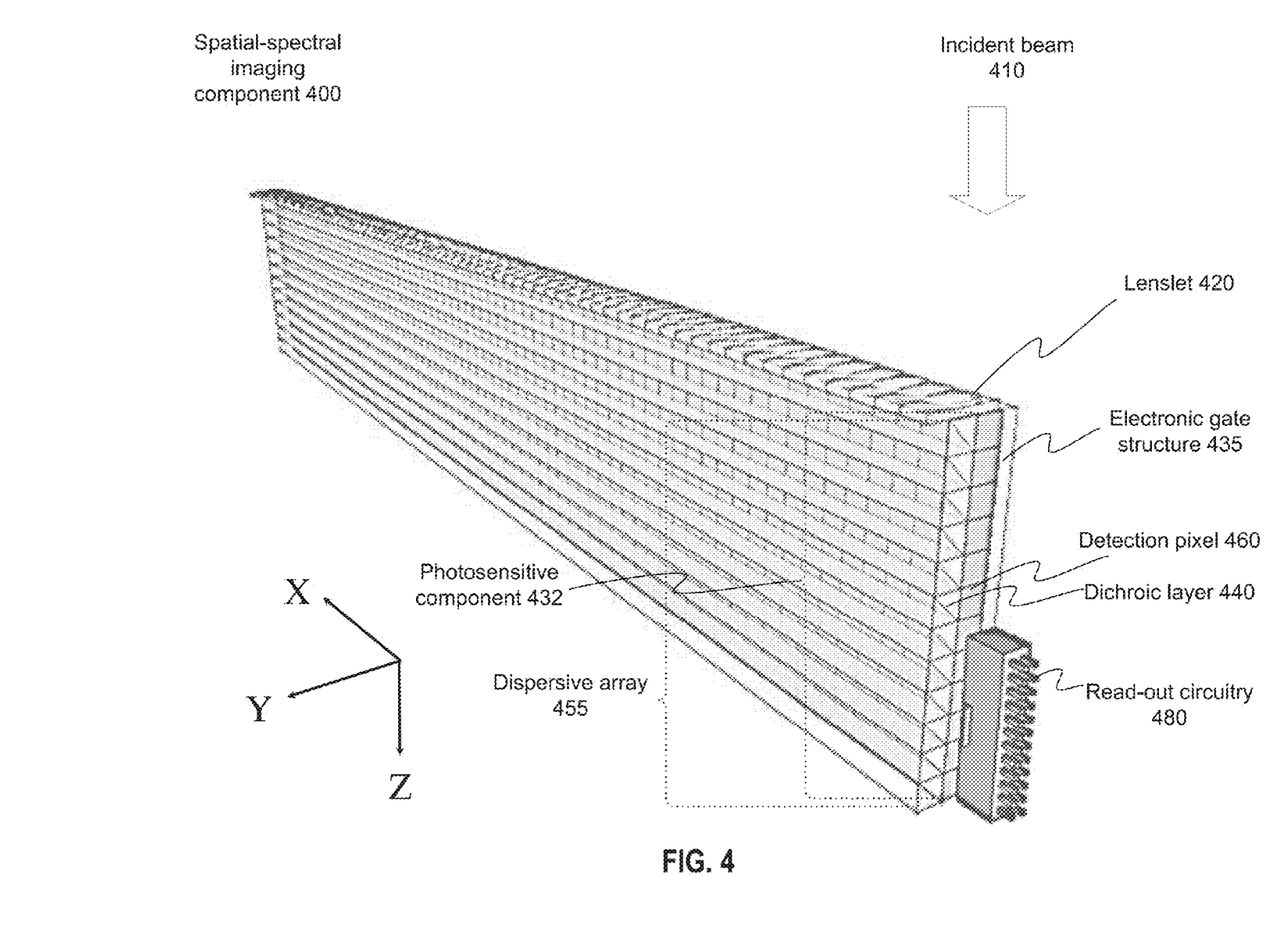
FIG. 4 is a block diagram illustration of a spatial-spectral imaging component in accordance to one embodiment.
Figure 5:
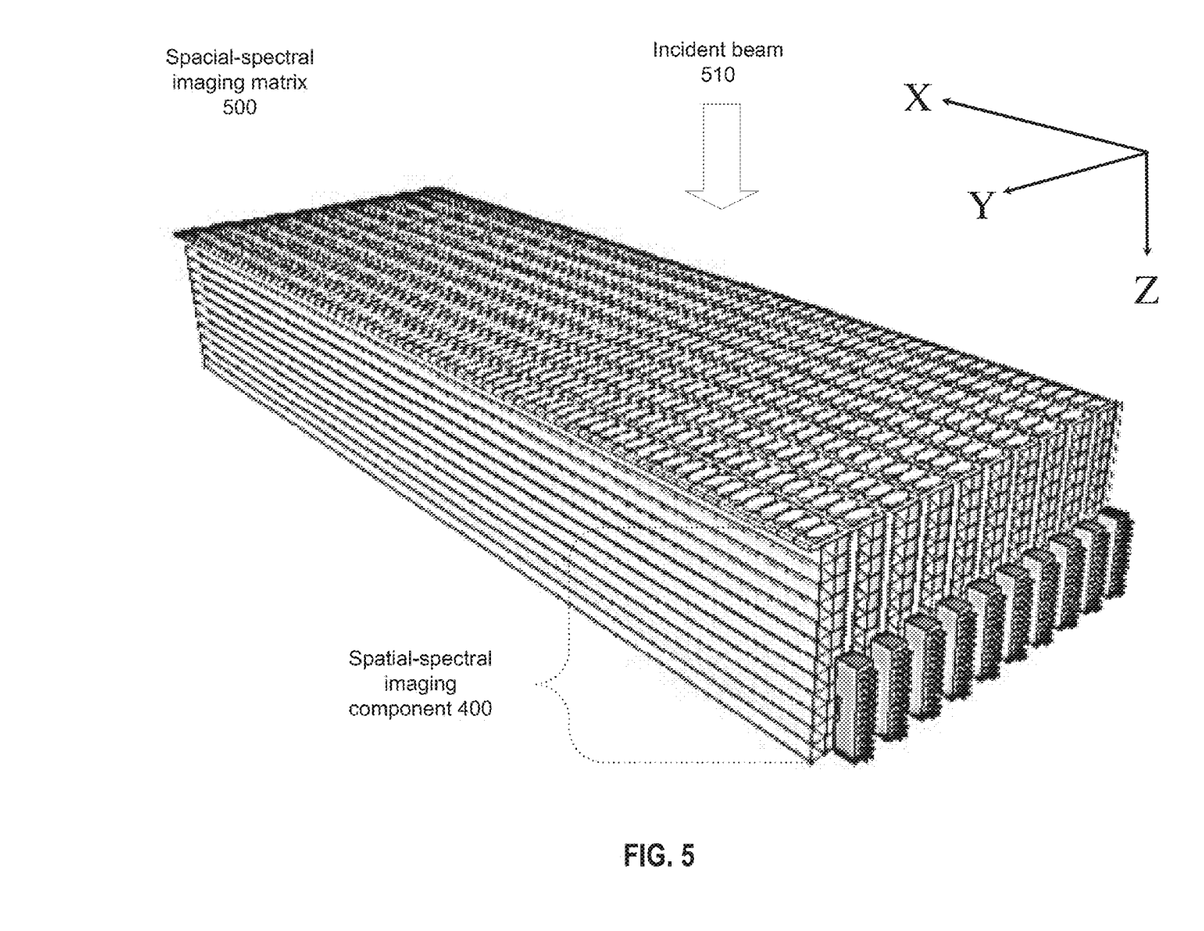
FIG. 5 is a block diagram illustration of a spatial-spectral imaging component in accordance to one embodiment.
Figure 6:
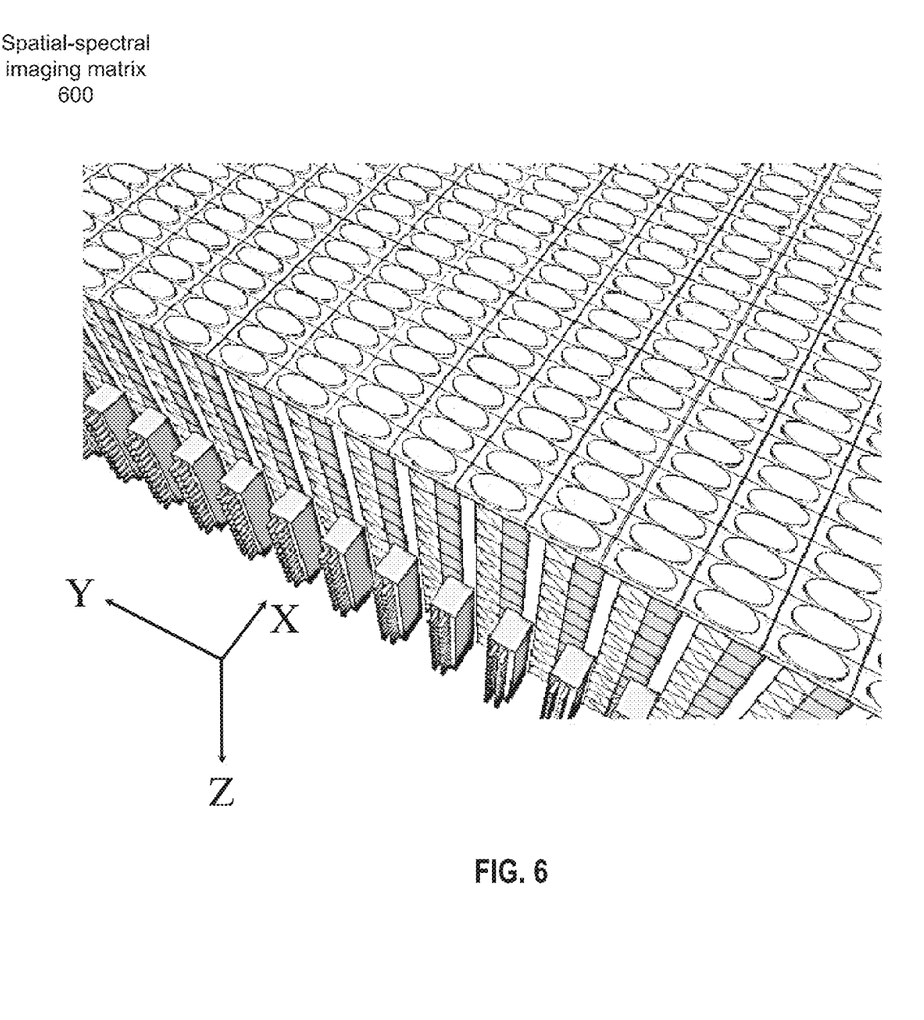
FIG. 6 is a block diagram illustration of a spatial-spectral imaging matrix in accordance to another embodiment.

FIG. 4 is a block diagram illustration of a spatial-spectral imaging component 400 in accordance to one embodiment. Spatial-spectral imaging component 400 contains a plurality of spectral-imaging devices (e.g., FIG. 1, spectral device 100) disposed in a line perpendicular to the incident beam 410. An incident beam 410 may be a beam of light incident (e.g., incident light 105) on the spectral device (e.g., spectral device 100) which contains a principal ray (e.g., principal ray 110A), the on-axis (i.e., Z-axis) ray that is perpendicular to the X-Y plane. An incident beam 410 may also contain off-axis rays that are either diverging or converging (i.e., not perpendicular). Transmitted light (e.g. incident beam 410) from the foreoptics falls upon the microlens elements (e.g., lenslet 420), and passes though the dispersive array (e.g., dispersive array 455) with reflected light of a progressively increasing wavelength reflected by the stacked dichroic layers (e.g., dichroic layer 440) as one moves through the dispersive array 455 in the Z-direction, to illuminate the adjacent detection pixel (e.g., detection pixel 460) in the photosensitive component 432. The associated electrical signal is produced by the photosensitive component 432 and passed to the electronic gate structure (e.g., electronic gate structure 435). The electronic signal is passed from the electronic gate structure (e.g., electronic gate structure 435) to the read-out circuitry 480 principally in the X- or negative X-direction. The photosensitive component 432 of each spatial-spectral imaging component 400 in one embodiment may be fabricated as a single module. The dispersive array 455 component of each spatial-spectral imaging component in one embodiment may be fabricated as a single module. FIG. 5 is a block diagram illustration of a spatial-spectral imaging matrix 500 in accordance to one embodiment. The spatial-spectral imaging matrix 500 contains multiple spatial-spectral imaging components (e.g., spatial-spectral imaging component 400). The spatial-spectral imaging components (e.g., spatial-spectral imaging component 400) are arranged perpendicular to the incident beam 510. In the embodiment shown, there are Y=10 spatial-spectral imaging components each with spectral resolution R=12 and spatial resolution X=100. Thus, the focal plane would be imaged into X times Y=1000 distinct spatial locations, each with spectral intensity measurements in R=12 substantially distinct wavelength ranges. FIG. 6 is a block diagram illustration of a spatial-spectral imaging matrix 600 in accordance to another embodiment. Spatial-spectral imaging matrix 600 is a top down three-dimensional view of a matrix similar to FIG. 5.

Figure 7:
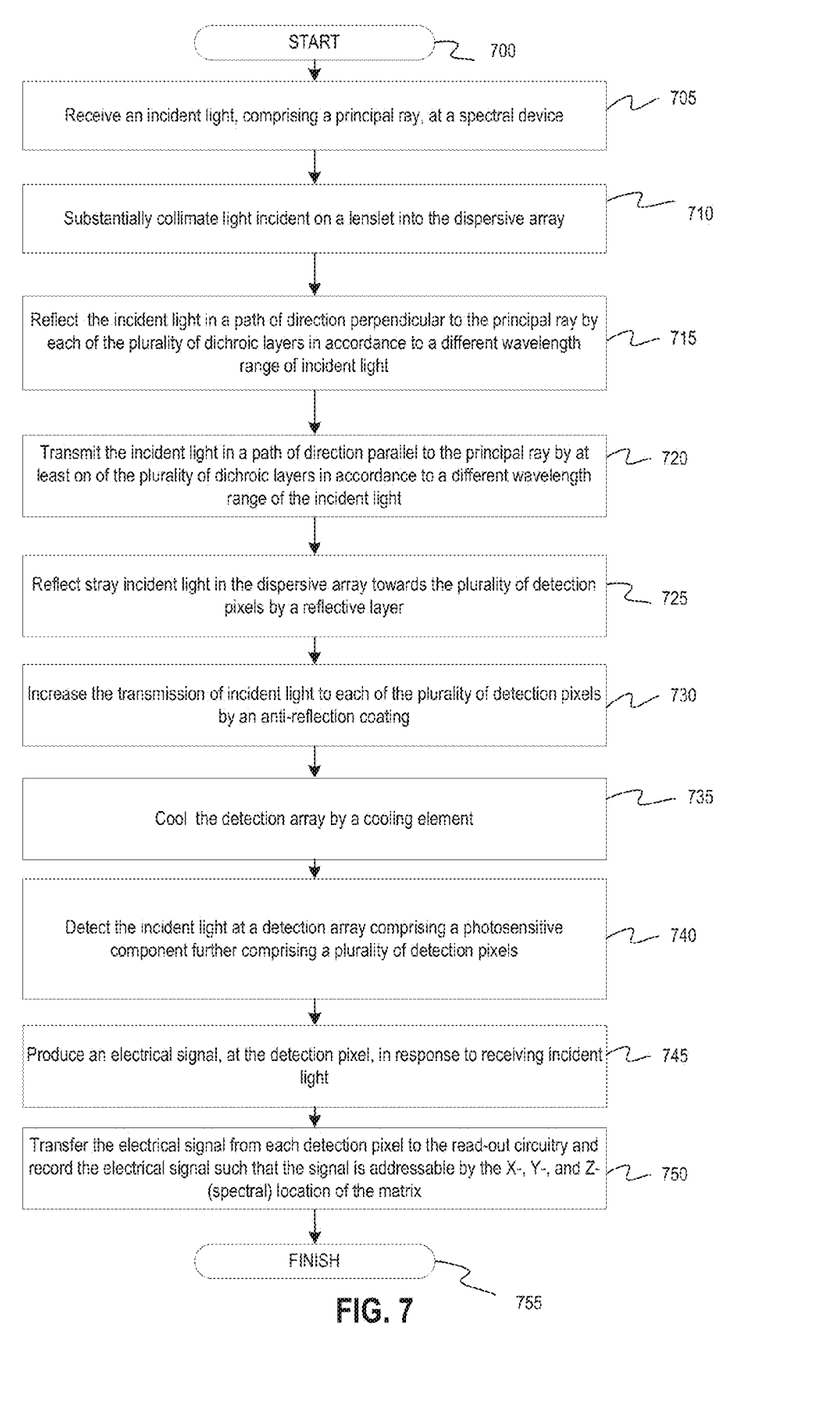
FIG. 7 is a flow diagram illustrating a method of detecting light, in accordance to one embodiment.

FIG. 7 is a flow diagram illustrating a method of detecting light, in accordance to one embodiment. For simplicity of explanation, the methods are depicted and described as a series of acts. Although the operations of the methods herein are shown and described in a particular order, such order does not mean that such operations are necessarily performed in that order. Operations in accordance with this disclosure can occur in various orders and/or concurrently, and with other acts not presented and described herein. Certain operations may be performed, at least in part, concurrently with other operations and certain operations may be performed in an inverse order to that shown or described.

FIG. 7 is a flow diagram illustrating a method of detecting light, in accordance to one embodiment. Method 700 begins at block 705 where method 700 receives an incident light (e.g. FIG. 1, incident light 105) on a spectral device (e.g., FIG. 1, spectral device 100). At block 710, method 700 substantially collimates light (e.g., FIG. 1, ray 111B, principal ray 110B, and ray 112B) incident on a lenslet (e.g., FIG. 1, ray 111A, principal ray 110A, and ray 112A) into the dispersive array (e.g., FIG. 1, dispersive array 155). In another embodiment, spectral device (e.g., FIG. 1, spectral device 100) does not contain a lenslet (e.g., FIG. 1, lenslet 120). At block 715, method 700 reflects the incident light (e.g. FIG. 1, incident light 105) in a path of direction perpendicular to the principal ray (e.g., FIG. 1, principal ray 110A) by each of plurality of dichroic layers (e.g., FIG. 1, dichroic layer 140, 142, 144) in accordance to different wavelength ranges of the incident light (e.g. FIG. 1, incident light 105). At block 720, method 700 transmits the incident light (e.g. FIG. 1, incident light 105) in a path of direction parallel to the principal ray (e.g., FIG. 1, principal ray 110A) by at least one of the plurality of dichroic layers (e.g., FIG. 1, dichroic layer 140, 142, 144) in accordance to a different wavelength range of incident light (e.g. FIG. 1, incident light 105). At block 725, method 700 reflects stray incident light (e.g. FIG. 1, incident light 105) in the dispersive array (e.g., FIG. 1, dispersive array 155) towards the plurality of detection pixels (e.g., FIG. 1, detection pixel 160, 161, 162), the stray incident light (e.g. FIG. 1, incident light 105) reflected by a reflective layer (e.g., FIG. 1, reflective layer 150). In another embodiment, a spectral device (e.g., FIG. 1, spectral device 100) does not contain a reflective layer (e.g., FIG. 1, reflective layer 150). At block 730, method 700 increases the transmission of incident light (e.g. FIG. 1, incident light 105) to each of the plurality of detection pixels (e.g., FIG. 1, detection pixel 160, 161, 162) by an anti-reflection coating (e.g., FIG. 1, anti-reflection coating 145). At block 735, method 700 cools the detection array (e.g., FIG. 1, detection array 130) by a cooling element (e.g., FIG. 3, cooling element 370). In one embodiment, a cooling element 370 is not required. At block 740, method 700 detects the incident light (e.g. FIG. 1, incident light 105) at a detection array (e.g., FIG. 1, detection array 130) comprising a plurality of detection pixels (e.g., FIG. 1, detection pixel 160, 161, 162). At block 745, method 700 produces an electric signal at the detection pixel (e.g., FIG. 1, detection pixel 160, 161, 162) in response to receiving incident light (e.g. FIG. 1, incident light 105). At block 745, method 700 transfers the electrical signal from each detection pixel (e.g., FIG. 1, detection pixel 160, 161, 162) to the read-out circuitry (e.g., FIG. 4, read-out circuitry 480) and records the electrical signal such that the electrical signal is addressable by a X-, Y-, and Z-location of the spatial-spectral imaging matrix (e.g., FIG. 5, spatial-spectral imaging matrix 500). At block 745, in order to record and save the digital signals in each detection pixel (e.g., FIG. 1, detection pixel 160, 161, 162), the digital signals will be typically transferred through the electronic gate structure (e.g., FIG. 1, electronic gate structure 135) along the X- and Z-directions to the read-out circuitry (e.g., FIG. 4, read-out circuitry 480). The recordings will be saved and addressable by the location of the detection pixel (e.g., FIG. 1, detection pixel 160, 161, 162) in the X-, Y-, and Z-direction. The time of recording and metadata about the nature of the apparatus (e.g., FIG. 5, spatial spectral imaging matrix 500) and setup will typically be stored digitally along with the X- by Y- by Z-dimensional "hyperspectral" image file. It should be noted that the some of the components discussed herein may be obtained from commercially available sources such as CCDs, comprising a photosensitive component (e.g., FIG. 1, photosensitive component 132), the electronic gate structure (e.g., FIG. 1, electronic gate structure 135), and readout circuitry (e.g., FIG. 4, read-out circuitry 480). The optional cooling element (e.g., FIG. 3, cooling element 370) may, in one embodiment, comprise a commercially available Peltier cooling device. In another embodiment, the cooling element (e.g., FIG. 3, cooling element 370) may be a cold stage as part of a multi-stage cooling system that may use liquid helium or liquid nitrogen as the main heat sink. The lenslet (e.g., FIG. 1, lenslet 120) can be manufactured, for example, as described in U.S. Pat. No. 5,286,338 with common material and practices, to best fulfill the optical specifications as described. In one embodiment, the dichroic layers (e.g., FIG. 1, dichroic layers 140, 142, 144) may be manufactured to best fulfill desired design specifications using common techniques, such as laminating a clear substrate with alternating layers of titanium oxide and silicon oxide using chemical vapor deposition (CVD), evaporation or sputtering or the like. Alternatively, as another example, each dispersive array (e.g., FIG. 1, dispersive array 155) may be manufactured using deep reactive ion etching (DRIE) techniques along with the layered deposition process on a Pyrex glass substrate such as described by X. H. Li et al. *Sens. Actuators, Phys. A*, vol. 87, pp. 139-145, 2001. In alternative embodiments, all mechanical components are bonded together with a resin or the like to create a rigid device; to preserve the integrity of the device at different temperatures, materials chosen for the components may have closely matched coefficients of thermal expansion.

The spectral device (e.g., FIG. 1, spectral device 100), spatial-spectral imaging component 400, and spatial-spectral imaging matrix 500 of the present disclosure may be used in numerous applications. For example, the present disclosure may be used for monitoring emissions from factories, security monitoring like border security and port monitoring, imaging from satellites, camera imaging for drug and chemical analysis, imaging of agriculture like assembly line control for fruit bruising, medical imaging, flame chemistry, industrial process monitoring, mineralogy, surveillance, and cameras for multi-wavelength imaging and video.

In one application, the spectral device (e.g., FIG. 1, spectral device 100) of the present disclosure may be used in RGB imaging in a consumer digital camera. An exemplary spatial-spectral imaging matrix (e.g., FIG. 5, spatial-spectral imaging matrix 500) for a consumer digital camera where R=3 is desired is one where the y- and x-size of spectral device (e.g., FIG. 1, spectral device 100) is 10 microns with a microlens array numbering 1600 by 1200 lenslets (e.g., FIG. 1, lenslet 120) (spanning the X and Y plane at the smallest-Z of the device) with three dichroic layers (e.g., FIG. 1, dichroic layer 140, 142, 144) within the dispersive array (e.g., FIG. 1, dispersive array 155). Dichroic layer n=1 has $\lambda_{c,1}$~500 nm, n=2 has $\lambda_{c,2}$=600 nm, and surface n=3 may be fully reflective.

In another application, the spectral device (e.g., FIG. 1, spectral device 100) of the present disclosure may be used in narrow-band imaging in several emission and absorption lines. Often it is desirable to obtain resolved imaging at several wavelengths of interest, such as at doubly ionized oxygen ([OIII] 495.9 nm+500.7 nm), Hα (656.3 nm), etc. Here, the y- and x-size of each lenslet (e.g., FIG. 1, lenslet 120) may be 20 microns in the X and Y directions. The spatial-spectral imaging matrix (e.g., FIG. 5, spatial-spectral imaging matrix 500) may consist of Y=512 spatial-spectral imaging components (e.g., FIG. 4, spatial-spectral imaging component 400), each with X=512 spectral devices (e.g., FIG. 1, spectral device 100), each with R=8. Dichroic layer n=1 has $\lambda_{c,1}$~450 nm, n=2 has $\lambda_{c,2}$=480 nm, n=3 has $\lambda_{c,3}$=520 nm, n=4 has $\lambda_{c,4}$=570 nm, n=5 has $\lambda_{c,5}$=630 nm, n=6 has $\lambda_{c,6}$=650 nm, n=7 has $\lambda_{c,7}$=680 nm, and n=8 has $\lambda_{c,8}$=710 nm. This provides an off-on-off view for determining the intensity (flux) in these particular spectral lines.

In another application, the spectral device (e.g., FIG. 1, spectral device 100) of the present disclosure may be used in spatially resolved low-resolution spectroscopy. In an exemplary spatial-spectral imaging matrix (e.g., FIG. 5, spatial-spectral imaging matrix 500), the y- and x-size of each lenslet (e.g., FIG. 1, lenslet 120) may be 20 micron in the X- and Y-directions. The spatial-spectral imaging matrix (e.g., FIG. 5, spatial-spectral imaging matrix 500) may consist of Y=2048 spatial-spectral imaging components (e.g., FIG. 4, spatial-spectral imaging components 400), each with X=2048 spectral devices (e.g., FIG. 1, spectral device 100), each with R=100. Here $\lambda c,1$=350 nm for n=1, $\lambda c,2$=356 nm for n=2, $\lambda c,3$=362 nm such that $\lambda n=\lambda n-1+6$ nm. This provides uniform spatial and spectral resolution. The signal-to-noise of faint sources can be maximized however by choosing wavelength spacing between dichroic layers (e.g., FIG. 1, dichroic layer 140 and 142) such that at portions of the spectrum where the detection efficiency is low, the wavelength spacing is larger (i.e., not uniformly spaced in wavelength).

To obtain an absolute measurement of the spectral intensity of light, a user of a spectral device 100 would typically perform a calibration to convert the read-out digital signal from the spectral device 100. In one approach, the user would expose the spectral device 100 to a light beam (e.g., FIG. 1, incident light 105) with a known spectral intensity at the location of the focal plane and record the digital measurements resulting from the incoming beam (e.g., FIG. 1, incident light 105). The user would also record the digital measurements resulting from an accumulation of digital recordings with no light exposure (this may be a result of dark current in the photosensitive component 132 and read-noise from the readout electronics (e.g. electronic gate structure 135 and read-out circuitry 480). The user would then expose the spectral device 100 to the desired beam (e.g., FIG. 1, incident light 105) and, in post processing, use the recorded calibration information to transform the recorded digital information on the desired beam (e.g., FIG. 1, incident light 105) to the desired absolute units.

For spatial-spectral imaging modules (e.g., FIG. 4, spatial-spectral imaging module 400) and spatial-spectral matrices (e.g., FIG. 5, spatial-spectral imaging matrix 500), an additional calibration may be desirable. The user would expose the spatial-spectral imaging module 400 or spatial-spectral imaging matrix 500 to a scene with known spatial distribution at the focal plane (such as an image of a series of equally spaced pin-holes) and record the digital measurements in each spectral device 100. From such measurements a mapping between spectral device 100 (indexed by X and Y) and physical or angular units can be obtained.

Embodiments of this invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

The terms "under," "between," "adjacent," down" as used herein refer to a relative position of one layer or component with respect to other layers or components. As such, for example, one layer or components disposed adjacent another component or layer may be directly in contact with the other layer or component or have one or more intervening layers or components. Additionally, the relative position and layers and components with respect to others (e.g., down or below) is providing assuming operations are performed relative to received incident light without consideration of the absolute orientation of the device. The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular implementations may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An apparatus, comprising:
    a dispersive array to receive an incident light comprising a principal ray, the dispersive array comprising a plurality of dichroic layers, each of the plurality of dichroic layers disposed in a path of a direction of the principal ray, each of the plurality of dichroic layers configured to at least one of reflect or transmit a different wavelength range of the incident light; and
    a detection array operatively coupled with the dispersive array, the detection array comprising a photosensitive component further comprising a plurality of detection pixels, each of the plurality of detection pixels having a light receiving surface disposed parallel to the direction of the principal ray to detect a respective one of the different wavelength ranges of incident light reflected from a corresponding one of the plurality of dichroic layers.

2. The apparatus of claim 1, wherein the detection array further comprises an electronic gate structure.

3. The apparatus of claim 2, wherein the detection array is front-side illuminated, the electronic gate structure arranged nearest the dispersive array followed by the photosensitive component.

4. The apparatus of claim 2, wherein the detection array is back-side illuminated, the photosensitive component arranged nearest the dispersive array followed by the electronic gate structure.

5. The apparatus of claim 1, further comprising:
    a lenslet, coupled to the dispersive array to direct the light incident on the lenslet into the dispersive array.

6. The apparatus of claim 1, further comprising:
    a reflective layer coupled to the dispersive array on a side opposite to plurality of detection pixels to reflect incident light towards the plurality of detection pixels.

7. The apparatus of claim 1, further comprising:
    an anti-reflection coating disposed between the dispersive array and the detection array.

8. The apparatus of claim 7, wherein the anti-reflection coating comprises a plurality of regions, each region corresponding to an adjacent detection pixel, each region optimizing a transmission of a different wavelength range of the incident light.

9. The apparatus of claim 1, further comprising:
a cooling element, coupled to the detection array, configured to thermally cool the detection array.

10. The apparatus of claim 1, wherein at least one of the plurality of detection pixels comprises a charge coupled device.

11. The apparatus of claim 1, wherein the wavelength of incident light reflected by each successive dichroic layer of the plurality dichroic layers in the direction of the principle ray is greater than the wavelength reflected by preceding dichroic layers.

12. The apparatus of claim 1, wherein a bandpass wavelength at which the incident light is reflected is lesser in at least one of the plurality of dichroic layers successively disposed in the direction of the principal ray.

13. A method, comprising:
receiving an incident light, comprising a principal ray, at a dispersive array, the dispersive array comprising a plurality of dichroic layers, each of the plurality of dichroic layers disposed in a path of a direction of the principal ray;
reflecting the incident light in a path of direction perpendicular to the principal ray by each of the plurality of dichroic layers in accordance to a different wavelength range of the incident light;
transmitting the incident light in a path of direction parallel to the principal ray by at least one of the plurality of dichroic layers in accordance to a different wavelength range of the incident light; and
detecting the incident light reflected by each of the plurality of dichroic layers at a detection array, the detection array comprising a photosensitive component further comprising a plurality of detection pixels, each of the plurality of detection pixels having a light receiving surface disposed parallel to the direction of the principal ray to detect a respective one of the different wavelength ranges of incident light.

14. The method of claim 13, wherein a bandpass wavelength at which the incident light is reflected is greater in at least one of the plurality of dichroic layers successively disposed in the direction of the principal ray.

15. The method of claim 13, wherein a bandpass wavelength at which the incident light is reflected is lesser in at least one of the plurality of dichroic layers successively disposed in the direction of the principal ray.

16. The method of claim 13, further comprising:
producing an electrical signal, at the detection pixel, in response to receiving incident light at the light receiving surface.

17. The method of claim 13, further comprising:
reflecting a stray incident light in the dispersive array towards the plurality of detection pixels, the stray incident light reflected by a reflective layer coupled to the dispersive array on a side opposite to plurality of detection pixels.

18. The method of claim 13, further comprising:
increasing a transmission of incident light to each of the plurality of detection pixels by an anti-reflection coating, the anti-reflection coating disposed between the dispersive array and the detection array.

19. The method of claim 13, further comprising:
cooling the detection array by a cooling element, the cooling element coupled to the detection array.

20. A spatial-spectral imaging matrix comprising:
a plurality of spatial-spectral imaging components to receive an incident light comprising a principal ray, each of the plurality of spatial-spectral imaging components disposed in a path of direction perpendicular to the principal ray, each of the plurality of spatial-spectral imaging components comprising a plurality of spectral devices, each of the spectral devices disposed adjacent to one another in the path of direction perpendicular to the principal ray, each of the spectral devices comprising:
a dispersive array to receive the incident light comprising the principal ray, the dispersive array comprising a plurality of dichroic layers, each of the plurality of dichroic layers disposed in a path of a direction of the principal ray, each of the plurality of dichroic layers configured to at least one of reflect or transmit a different wavelength range of the incident light; and
a detection array operatively coupled with the dispersive array, the detection array comprising a photosensitive component further comprising a plurality of detection pixels, each of the plurality of detection pixels having a light receiving surface disposed parallel to the direction of the principal ray to detect a respective one of the different wavelength ranges of incident light reflected from a corresponding one of the plurality of dichroic layers.

* * * * *